United States Patent [19]
Vermeersch et al.

[11] Patent Number: 6,071,369
[45] Date of Patent: Jun. 6, 2000

[54] METHOD FOR MAKING AN LITHOGRAPHIC PRINTING PLATE WITH IMPROVED INK-UPTAKE

[75] Inventors: Joan Vermeersch, Deinze; Marc Van Damme, Heverlee; Johan Van Hunsel, Alken, all of Belgium; Fred Marland, N. Billerica, Mass.

[73] Assignee: Agfa-Gevaert, N.V., Mortsel, Belgium

[21] Appl. No.: 08/949,189

[22] Filed: Oct. 14, 1997

Related U.S. Application Data

[60] Provisional application No. 60/032,942, Dec. 9, 1996.

[30] Foreign Application Priority Data

Oct. 29, 1996 [EP] European Pat. Off. ............. 96203004

[51] Int. Cl.$^7$ ..................................... B32B 31/00
[52] U.S. Cl. ..................... 156/272.8; 156/274.4; 101/395; 101/456; 101/457; 101/458; 101/462; 101/463.1; 101/465; 101/466; 101/467; 430/200; 430/204; 430/964
[58] Field of Search .................................... 430/201, 200, 430/964, 204; 101/456, 450, 457, 459, 460, 461, 462, 463.1, 465–467, 395; 156/272.8, 274.4

[56] References Cited

U.S. PATENT DOCUMENTS

| | | | |
|---|---|---|---|
| 4,063,949 | 12/1977 | Uhlig et al. | 96/27 E |
| 5,212,030 | 5/1993 | Figov | 430/49 |
| 5,385,092 | 1/1995 | Lewis et al. | 101/467 |
| 5,540,150 | 7/1996 | Lewis et al. | 101/467 |
| 5,607,810 | 3/1997 | Verburgh et al. | 430/201 |
| 5,638,753 | 6/1997 | Lewis et al. | 101/454 |

*Primary Examiner*—Merrick Dixon
*Attorney, Agent, or Firm*—Breiner & Breiner

[57] ABSTRACT

According to the present invention there is provided a method for making a lithographic printing plate comprising the image-wise exposure of a heat-sensitive imaging element with a laser and developing said imaging element by rinsing it with plain water or an aqueous solution. To improve ink-uptake the imaging element is exposed on an external drum recorder whereby the pixel dwell time of the laser is above $0.1\ \mu s$

9 Claims, No Drawings

METHOD FOR MAKING AN LITHOGRAPHIC PRINTING PLATE WITH IMPROVED INK-UPTAKE

This application claims priority from Provisional Application number 60/032,942 filed Dec. 9,1996.

DESCRIPTION

1. Field of the Invention

The present invention relates to a method for making a lithographic printing plate involving the use of a heat-sensitive imaging element. More in particular the present invention relates to a method wherein the heat-sensitive imaging element is exposed with a laser on an external drum. After exposure the imaging-element is developed by means of plain water or an aqueous solution.

2. Background of the Invention

Lithographic printing is the process of printing from specially prepared surfaces, some areas of which are capable of accepting ink, whereas other areas will not accept ink.

In the art of photolithography, a photographic material is made imagewise receptive to oily or greasy ink in the photo-exposed (negative working) or in the non-exposed areas (positive working) on a ink-repelling background.

In the production of common lithographic plates, also called surface litho plates or planographic printing plates, a support that has affinity to water or obtains such affinity by chemical treatment is coated with a thin layer of a photo-sensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of such light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of stability of sensitivity in view of the storage time and they show a lower resolution. The trend towards heat-sensitive printing plate precursors is clearly seen on the market.

For example, Research Disclosure No. 33303 of January 1992 discloses a heat-sensitive imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink acceptant without any further development. A disadvantage of this method is that the printing plate obtained is easily damaged since the non-printing areas may become ink-accepting when some pressure is applied thereto. Moreover, under critical conditions, the lithographic performance of such a printing plate may be poor and accordingly such printing plate has little lithographic printing latitude.

EP-A-514145 discloses a heat-sensitive imaging element including a coating comprising core-shell particles having a water insoluble heat softenable core component and a shell component which is soluble or swellable in an aqueous alkaline medium. Red or infrared laser light directed image-wise at said imaging element causes selected particles to coalesce, at least partially, to form an image and the non-coalesced particles are then selectively removed by means of an aqueous alkaline developer. Afterwards a baking step is performed. However the printing endurance of a so obtained printing plate is low.

EP-A-599510 discloses a heat-sensitive imaging element which comprises a substrate coated with (i) a layer which comprises (1) a disperse phase comprising a water-insoluble heat softenable component A and (2) a binder or continuous phase consisting of a component B which is soluble or swellable in aqueous, preferably aqueous alkaline medium, at least one of components A and B including a reactive group or precursor therefor, such that insolubilisation of the layer occurs at elevated temperature and/or on exposure to actinic radiation, and (ii) a substance capable of strongly absorbing radiation and transferring the energy thus obtained as heat to the disperse phase so that at least partial coalescence of the coating occurs. After image-wise irradiation of the imaging element and developing the image-wise irradiated plate, said plate is heated and/or subjected to actinic irradiation to effect insolubilisation. However the printing endurance of a so obtained printing plate is low.

Furthermore EP-A 952022871.0, 952022872.8, 952022873.6 and 952022874.4 disclose a method for making a lithographic printing plate comprising the steps of (1) image-wise exposing to light a heat-sensitive imaging element comprising (i) on a hydrophilic surface of a lithographic base an image-forming layer comprising hydrophobic thermoplastic polymer particles dispersed in a hydrophilic binder and (ii) a compound capable of converting light to heat, said compound being comprised in said image-forming layer or a layer adjacent thereto; (2) and developing a thus obtained image-wise exposed element by rinsing it with plain water.

The above discussed heat-sensitive recording systems can be imaged with rotating drum image setters using one or more laser beams. A disadvantage is that the ink-uptake is not always satisfactory.

SUMMARY OF THE INVENTION

It is an object of the present invention to provide a method for making a lithographic printing plate having excellent printing properties, developable in a convenient ecological way.

It is further an object of the present invention to provide a method for making lithographic printing plates with improved ink-uptake imageable on a drum.

Further objects of the present invention will become clear from the description hereinafter:

According to the present invention there is provided a method for making a lithographic printing plate comprising the steps of image-wise exposing with a laser a heat-sensitive imaging element comprising an image-forming layer and thermoplastic polymer particles and developing the exposed element characterised in that the pixel dwell time of the laser is between 0.1 $\mu$s and 50 $\mu$s.

Furthermore for use in the method of this invention there is provided a heat-sensitive imaging element comprising on the hydrophilic surface of a lithographic base, an image-forming layer comprising hydrophobic thermoplastic polymer particles dispersed in a hydrophilic binder and a compound capable of converting light into heat present in said image-forming layer or a layer adjacent thereto.

After exposure the heat-sensitive imaging element is developed by rinsing it with plain water or an aqueous solution.

DETAILED DESCRIPTION OF THE INVENTION

It has been found that according to the present invention, using an imaging element as described above, lithographic printing plates of high quality with improved ink-uptake can be obtained by exposing said imaging element with a laser with a pixel dwell time of at least 0.1 $\mu$s, more preferably at least 0.3 $\mu$s, most preferably at least 0.5 $\mu$s. Said printing plates are provided in an ecologically acceptable way.

The maximum dwell time is not so important but is for practical reasons less than 50 $\mu$s, more preferably less than 20 $\mu$s.

FR 1,561,957 describes an imaging element with a pixel dwell time between $10^{-2}$ and $10^{-4}$ s., quite a different time scale than mentioned in the present invention.

U.S. Pat. No. 5,238,778 discloses the exposure of a sensitive element at a scanning speed of 300 m/second but does not disclose the pixel dwell time.

EP-A- 601,236 discloses irradiation of a sensitive element with a dwell time of 214 ns, the composition of said element being quite different from the composition of the sensitive element according to the present invention.

EP-A- 160,395 discloses irradiation of a sensitive element without however specifying the pixel dwell time. The composition of said sensitive element is quite different from the composition of the sensitive element according to the present invention.

EP-A- 580,394 discloses the composition of an external drum recorder but is silent about pixel dwell times.

FR 2,287,715 discloses irradiation of a sensitive element without however specifying the pixel dwell time. The composition of said sensitive element is quite different from the composition of the sensitive element according to the present invention.

WO 94/18005 discloses irradiation of a sensitive element without however specifying the pixel dwell time. The composition of said sensitive element is quite different from the composition of the sensitive element according to the present invention.

Image-wise exposure in connection with the present invention is preferably an image-wise scanning exposure involving the use of a laser that operates in the infrared or near-infrared, i.e. wavelength range of 700–1500 nm. Most preferred are laser diodes emitting in the near-infrared.

To improve ink-uptake of the imaging element according to the present invention said imaging element is exposed with a laser having a pixel dwell time of at least 0.1 $\mu$s. As a preferred imaging apparatus suitable for the image-wise laser exposure in accordance with the present invention an external drum recorder is used, in which the imaging element is fitted to the outside surface of a rotating drum and exposed by a light source travelling axially along the outer periphery of the drum. Optionally the print cylinder of the printing press itself can constitute the drum of the imaging apparatus.

In the present invention a heat-sensitive imaging element is used comprising on a hydrophilic surface of a lithographic base an image-forming layer comprising hydrophobic thermoplastic polymer particles dispersed in a hydrophilic binder. The hydrophilic binder used in connection with the present invention is preferably not crosslinked or only slightly crosslinked. The imaging element further includes a compound capable of converting light into heat. This compound is comprised in the image-forming layer or a layer adjacent thereto.

According to one embodiment of the present invention the lithographic base can be aluminum e.g. electrochemically and/or mechanically grained and anodised aluminum.

According to another embodiment in connection with the present invention, the lithographic base can comprise a flexible support, such as e.g. paper or plastic film, provided with a cross-linked hydrophilic layer. A particularly suitable cross-linked rough hydrophilic layer may be obtained from a hydrophilic binder cross-linked with a cross-linking agent such as formaldehyde, glyoxal, polyisocyanate or preferably a hydrolysed tetra-alkylorthosilicate.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers.

A cross-linked hydrophilic layer on a flexible support used in accordance with the present embodiment preferably also contains substances that increase the mechanical strength and the porosity of the layer e.g. colloidal silica. In addition inert particles of larger size than the colloidal silica can be added e.g. silica prepared according to Stöbber as described in J. Colloid and Interface Sci., Vol. 26, 1968, pages 62 to 69 or alumina particles or particles having an average diameter of at least 100 nm which are particles of titanium dioxide or other heavy metal oxides. Incorporation of these particles gives the surface of the cross-linked hydrophilic layer a uniform rough texture consisting of microscopic hills and valleys.

The thickness of the cross-linked hydrophilic layer may vary in the range of 0.2 to 25 $\mu$m and is preferably 1 to 10 $\mu$m.

Particular examples of suitable cross-linked hydrophilic layers for use in accordance with the present invention are disclosed in EP-A 601240, GB-P-1419512, FR-P-2300354, U.S. Pat. No. 3971660, U.S. Pat. No. 4284705 and EP-A 514490.

As flexible support of a crosslinked hydrophilic layer in connection with the present embodiment it is particularly preferred to use a plastic film e.g. substrated polyethylene terephthalate film, polyethylene naphthalate film, cellulose acetate film, polystyrene film, polycarbonate film etc. . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525.

Optionally, there may be provided one or more intermediate layers between the hydrophilic support and the image-forming layer. An image-forming layer in connection with the present invention comprises thermoplastic polymer particles dispersed in a hydrophilic binder.

Suitable hydrophilic binders for use in an image-forming layer in connection with this invention are water soluble (co)polymers for example synthetic homo- or copolymers such as polyvinylalcohol, a poly(meth)acrylic acid, a poly (meth)acrylamide, a polyhydroxyethyl(meth)acrylate, a polyvinylmethylether or natural binders such as gelatin, a polysaccharide such as e.g. dextran, pullulan, cellulose, arabic gum, alginic acid.

The hydrophilic binder can also be a water insoluble, alkali soluble or swellable resin having phenolic hydroxy groups and/or carboxyl groups.

Preferably the water insoluble, alkali soluble or swellable resin used in connection with the present invention comprises phenolic hydroxy groups. Suitable water insoluble, alkali soluble or swellable resins for use in an image-forming layer in connection with this invention are for example synthetic novolac resins such as ALNOVOL, a registered trade mark of Reichold Hoechst and DUREZ, a registered trade mark of Oxychem and synthetic polyvinylfenols such as MARUKA LYNCUR M, a registered trade mark of Dyno Cyanamid.

The hydrophilic binder of the image-forming layer used in connection with the present invention is preferably not cross-linked or only slightly cross-linked.

The thermoplastic polymer particles preferred in the embodiment of this invention are hydrophobic polymer particles. The hydrophobic thermoplastic polymer particles used in connection with the present invention preferably have a coagulation temperature above 50° C. and more preferably above 70° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition temperature of the polymer particles. Preferably the coagulation temperature is at least 10° C. below the temperature at which the decomposition of the polymer particles occurs. When said polymer particles are subjected to a temperature above the coagulation temperature they coagulate to form a hydrophobic agglomerate in the hydrophilic layer so that at these parts the hydrophilic layer becomes insoluble in plain water or an aqueous liquid.

Specific examples of hydrophobic polymer particles for use in connection with the present invention with a Tg above 80° C. are preferably polyvinyl chloride, polyvinylidene chloride, polyacrylonitrile, polyvinyl carbazole etc., copolymers or mixtures thereof. Most preferably used are polystyrene, polymethyl-methacrylate or copolymers thereof.

The weight average molecular weight of the polymers may range from 5,000 to 1,000,000 g/mol.

The hydrophobic particles may have a particle size from 0.01 $\mu$m to 50 $\mu$m, more preferably between 0.05 $\mu$m and 10 $\mu$m and most preferably between 0.05 $\mu$m and 2 $\mu$m.

The polymer particles are present as a dispersion in the aqueous coating liquid of the image-forming layer and may be prepare by the methods disclosed in U.S. Pat. No. 3,476,937. Another method especially suitable for preparing an aqueous dispersion of the thermoplastic polymer particles comprises:
dissolving the hydrophobic thermoplastic polymer in an organic water immiscible solvent,
dispersing the thus obtained solution in water or in an aqueous medium and
removing the organic solvent by evaporation.

The amount of hydrophobic thermoplastic polymer particles contained in the image-forming layer is preferably at least 30% by weight and more preferably at least 45% by weight and most preferably at least 60% by weight.

The image-forming layer can also comprise crosslinking agents although this is not necessary. Preferred crosslinking agents are low molecular weight substances comprising a methylol group such as for example melamine-formaldehyde resins, glycoluril-formaldehyde resins, thiourea-formaldehyde resins, guanamine-formaldehyde resins, benzoguanamine-formaldehyde resins. A number of said melamine-formaldehyde resins and glycoluril-formaldehyde resins are commercially available under the trade names of CYMEL (Dyno Cyanamid Co., Ltd.) and NIKALAC (Sanwa Chemical Co., Ltd.).

The imaging element further includes a compound capable of converting light to heat. This compound is preferably comprised in the image-forming layer but can also be provided in a layer adjacent to the image-forming layer. Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared dyes, carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. The lithographic performance and in particular the print endurance obtained depends on the heat-sensitivity of the imaging element. In this respect it has been found that carbon black yields very good and favorable results.

A light-to-heat converting compound in connection with the present invention is most preferably added to the image-forming layer but at least part of the light-to-heat converting compound may also be comprised in a neighbouring layer.

According to a method in connection with the present invention for obtaining a printing plate, the imaging element is image-wise exposed and subsequently developed by rinsing it with plain water.

In accordance with an alternative method of the present invention the imaging element is image-wise exposed and subsequently mounted on a print cylinder of a printing press. It may be advantageous to wipe the image forming layer of an image-wise exposed imaging element with e.g. a cotton pad or sponge soaked with water before mounting the imaging element on the press before the printing press starts running to remove some non-image forming areas, but this will not actually develop the imaging element.

According to a further method, the imaging element is first mounted on the printing cylinder of the printing press and then image-wise exposed directly on the press. Subsequent to exposure, the imaging element can be developed as described above.

The printing plate of the present invention can also be used in the printing process as a seamless sleeve printing plate. In this option the printing plate is soldered in a cylindrical form by means of a laser. This cylindrical printing plate which has as diameter the diameter of the print cylinder is slided on the print cylinder instead of applying in a classical way a classically formed printing plate. More details on sleeves are given in "Grafisch Nieuws", 15, 1995, page 4 to 6.

After the development of an image-wise exposed imaging element with an aqueous solution and drying the obtained plate can be used as a printing plate as such. However, it is still possible to bake said plate at a temperature between 100° C. and 330° C. for a period of 20 minutes to 1 minute. For example the exposed and developed plates can be baked at a temperature of 235° C. for 2 minutes, at a temperature of 200° C. for 5 minutes or at a temperature of 120° C. for 10 minutes.

The following example illustrates the present invention without limiting it thereto. All parts and percentages are by weight unless otherwise specified.

EXAMPLE 1

Preparation of the lithographic base

A 0.15 μmm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/m² to form a surface topography with an average center-line roughness Ra of 0.5 μm.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 A/m² for about 300 seconds to form an anodic oxidation film of 3.00 g/m² of $Al_2O_3$, then washed with demineralized water, posttreated with a solution containing 20 g/l of sodium bicarbonate at 40° C. for 30 seconds, subsequently rinsed with demineralized water at 20° C. during 120 seconds and dried.

The grained and anodized lithographic base was then submersed in an aqueous solution containing 5% w/w of citric acid for 60 seconds, brought at pH 7 with an aqueous solution of sodium hydroxyde 2 N for 60 seconds, rinsed with demineralized water and dried at 25° C.

Preparation of the coating composition for the recording layer

To 140 g of a 20% w/w dispersion of a copolymer of styrene/methyl methacrylate (20:80, particle diameter of 103 nanometer) stabilized with the polyethyleneoxide surfactant Hostapal B (2% w/w vs. polymer, HOSTAPAL is available from Hoechst) in deionized water was subsequently added, while stirring, 26 g of a 15% w/w dispersion of carbon black containing a wetting agent in water, 434 g of water, 400 g of a 2% w/w solution of a 98% hydrolyzed polyvinylacetate, having a weight average molecular weight of 200,000 g/mol (MOWIOL 56–98 available from Hoechst) in water.

Preparation of the imaging element

An imaging element according to the invention was produced by preparing the above described coating composition for the infrared recording layer, coating it onto the above described lithographic base in an amount of 30 g/m² (wet coating amount) and drying it at 36° C.

Preparation of a printing plate and making copies thereof.

The imaging element was exposed on an external drum recorder with a scanning infrared laser emitting at 1.06 μm (scanspeed 2.2 m/s, spot size 10 μm and energy in the image plane of 248 mJ/cm²) with a pixel dwell time of 4.8 μs. In a comparing test the imaging element was exposed on an internal drum recorder with a scanning infrared laser emitting at 1.06 μm (scanspeed 218 m/s, spotsize 10 μm and energy in the image plane of 248 mJ/cm²) with a pixel dwell time of 0.05 μs.

After imaging the plates were processed with plain water. The obtained lithographic printing plates were used to print in an identical way on a conventional offset press using a commonly employed ink and fountain. The density of the printed images was measured after a specified number of prints. The results are given in table 1.

TABLE 1

| | Density | |
| --- | --- | --- |
| Number of prints | Pixel dwell time = 0.05 μs | Pixel dwell time = 4.8 μs |
| 1 | 0 | 0.73 |
| 5 | 0.10 | 1.24 |
| 10 | 0.20 | 1.30 |
| 15 | 0.48 | 1.30 |
| 20 | 0.63 | 1.30 |
| 25 | 0.72 | 1.30 |
| 50 | 0.97 | 1.30 |
| 100 | 1.05 | 1.30 |

It is clear from the results in table 1 that imaging at a short pixel dwell time gives rise to unacceptable ink-uptake. When imaging is performed at a high pixel dwell time an excellent ink-uptake is obtained after a limited number (<10) of prints.

EXAMPLE

The imaging element was prepared as described in example 1. The imaging element was then exposed on an external drum recorder with a scanning infrared laser emitting at 1.06 μm (scanspeed 17 m/s, spotsize 10 μm and energy in the plane of 248 mJ/cm²) with a pixel dwell time of 0.7 μs. Subsequently the imaging element was mounted on a printing press. After 10 revolutions clear prints were obtained with no ink-uptake in the non-image parts.

What is claimed is:

1. A method for obtaining a lithographic printing plate comprising the steps of image-wise exposing with a laser a heat-sensitive imaging element comprising thermoplastic hydrophobic polymer particles dispersed in a hydrophilic binder and developing the exposed element, said laser used in said exposure having a pixel dwell time of between 0.1 μs and 50 μs.

2. A method according to claim 1 wherein said pixel dwell time is obtained by exposing the imaging element on an external drum recorder.

3. A method according to claim 1 wherein said imaging element is mounted on the print cylinder of the printing press before exposure.

4. A method according to claim 1 wherein said imaging element comprises a lithographic base with a hydrophilic surface and thereon an image-forming layer comprising hydrophobic thermoplastic polymer particles dispersed in a hydrophilic binder and a compound which will convert light into heat present in said image-forming layer or a layer adjacent thereto.

5. A method according to claim 1 wherein said hydrophobic thermoplastic polymer particles have a coagulation temperature of at least 50° C.

6. A method according to claim 4 wherein said hydrophobic thermoplastic polymer particles have a Tg of at least 80° C.

7. A method according to claim 4 wherein said hydrophilic binder is a water soluble or swellable (co)polymer.

8. A method according to claim 4 wherein said lithographic base is anodised aluminium or comprises a flexible support having thereon a crosslinked hydrophilic layer.

9. A method according to claim 1 wherein said exposed imaging element is developed by wiping it with water or an aqueous solution.

* * * * *